United States Patent [19]

Terashima et al.

[11] Patent Number: 5,162,297
[45] Date of Patent: Nov. 10, 1992

[54] LIQUID PHASE EPITAXIAL GROWTH OF HIGH TEMPERATURE SUPERCONDUCTING OXIDE WAFER

[75] Inventors: Kazutaka Terashima; Katsuyoshi Fukuda, both of Kanagawa, Japan

[73] Assignee: Kabushiki Kaisha Toshiba, Kawasaki, Japan

[21] Appl. No.: 205,177

[22] Filed: Jun. 10, 1988

[30] Foreign Application Priority Data

| Jun. 11, 1987 | [JP] | Japan | 62-145719 |
| Jun. 11, 1987 | [JP] | Japan | 62-145721 |
| Dec. 3, 1987 | [JP] | Japan | 62-304631 |
| Dec. 3, 1987 | [JP] | Japan | 62-304632 |
| Dec. 3, 1987 | [JP] | Japan | 62-304633 |

[51] Int. Cl.[5] .................. C01F 17/00; C30B 9/00
[52] U.S. Cl. ............................ 505/1; 156/610; 156/621; 156/623 R; 505/729
[58] Field of Search .............. 156/610, 621, 623 R

[56] References Cited

U.S. PATENT DOCUMENTS

| 4,690,726 | 9/1987 | Luther et al. | 156/624 |
| 4,761,202 | 8/1988 | Bordui et al. | 156/622 |
| 4,793,894 | 12/1988 | Jacco et al. | 156/623 R |
| 4,824,826 | 4/1989 | Damento et al. | 505/1 |
| 4,921,834 | 5/1990 | Hasegawa et al. | 505/1 |
| 4,956,334 | 9/1990 | Oka et al. | 505/1 |

FOREIGN PATENT DOCUMENTS 0003092 1/1987 Japan .................. 156/618.1

OTHER PUBLICATIONS

Oka et al. Jap. Jour. Appl. Phys., 26 (Oct. 1987) L-1590.
Picone et al. in Mat. Res. Soc. Symp. Proc. #99 Nov. 30–Dec. 4, 1987, ed. Brodsky et al., p. 279.
Shamoto et al. Solid St. Comm. 66 (1988) 195.
Takagi et al. in MRS-Symp. Proc. #9 Nov. 30–Dec. 4, 1987, ed. Brodsky et al., p. 647.
Hidaka et al. Jap. Jour. Appl. Phys. 26 (May 1987) L-726.
Hidaka et al. Jap. Jour. Appl. Phys. 26 (April 1987) L377.
Hasegawa et al. Ibid, 26 (May 1987) L-673.
Takekawa et al. Jap. Jour. Appl. Phys. 26 (May 1987) L-851.
Kawabe et al. in High Tc Superconductors ed. Gubser et al., MRS Symp. April '87, p. 251.
Hayashi et al. Jap. Jour. Appl. Phys. 26 (July 1987) L-1197.
Laudise et al. Jour. Crystal Growth, 85 (1987) 569.
Hidaka et al. Jour. Crystal Growth 85 (1987) 581.
Yue et al. in High Tc Superconductors II ed. Capone II et al., MRS Symp. April '88, p. 85.
Liu et al. Jap. Jour. Appl. Phys. 27 (Aug. 88) L-1470.
Kaiser et al. Appl. Phys. Letts. 51 (Sep. '87) 1040.
Ono et al. Jap. Jour. Appl. Phys. 27 (1988) L-340.

*Primary Examiner*—Upendra Roy
*Attorney, Agent, or Firm*—Oblon, Spivak, McClelland, Maier & Neustadt

[57] ABSTRACT

This invention provides a method of manufacturing of a superconducting oxide wafer in which a plural system oxide superconducting single crystal thin film is grown by the liquid epitaxy process using the flux on a crystal substrate.

27 Claims, 15 Drawing Sheets

LIQUID PHASE EPITAXIAL GROWTH OF HIGH TEMPERATURE SUPERCONDUCTING OXIDE WAFER

BACKGROUND OF THE INVENTION

This invention relates to a method of manufacturing a superconducting oxide wafer. It especially, relates to the method of forming a plural system oxide single crystal thin film having superconducting characteristic on a crystal substrate.

The electric resistance of a metal decreases as a temperature falls. Even when, the temperature nears an absolute zero point, an ordinary metal has a finite electric resistance. However, it has been confirmed that the electric resistance of some metals vanishes suddenly at some temperature. A complete conductive state appearing in some metals at a critical temperature Tc or less is called a superconducting state, and this phenomenon is called the superconductivity phenomenon.

Recently, high temperature superconducting objects presenting the superconductivity phenomenon at the high temperature of the temperature of liquid nitrogen have been discovered. Especially, plural system oxide superconducting objects having the Perovstkite structure are of interest. Typical plural system oxide superconducting objects are the $YBa_2Cu_3O_{7-\delta}$ and the $(La, Ba)_2CuO_{4-y}$, etc.

These plural system oxide superconducting objects are manufactured by sintering, evaporating or sputtering processes, etc. It is a key technique that the superconducting objects be obtained as a thin film made by a single crystal to be widely applicable to new devices using the superconducting objects.

It has been reported to form the superconducting single crystal film on the substrate by melting the raw materials at 1000° C. or more and to cool gradually. However, the thin film was experimentally formed only as the very minute pieces. Large superconducting thin film necessary to be applicable to practical devices have not heretofore been manufactured by practical processes having reproducibility and mass-productivity. The realization of a large oxide superconducting single crystal thin film in which the superconducting transposition temperature is high, the operating characteristic is stable and the critical current is also large is strongly desired.

SUMMARY OF THE INVENTION

It is an object of the invention to provide an improved method of manufacturing a plural system oxide superconducting single crystal thin film on a single crystal substrate with good reproducibility and mass-productivity.

This invention provides a method of manufacturing a superconducting oxide wafer in which a plural system oxide superconducting single crystal thin film is grown by the liquid epitaxy process using a flux on a crystal substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
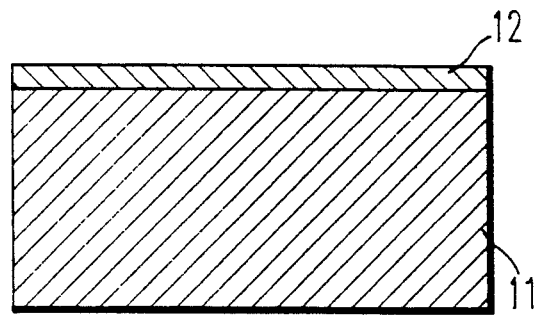
FIG. 1 is a sectional view of an epitaxy wafer obtained by the invention.

FIG. 1 is a sectional view of an epitaxy wafer obtained by the invention, a plural system oxide superconducting single crystal thin film 12 is formed by the epitaxy technique on a single crystal substrate 11. Embodiments of the invention will be explained below. The invention relates to the method of manufacturing the plural system oxide superconducting single crystal thin film using the epitaxy technique on the single crystal substrate.

Figure 2:
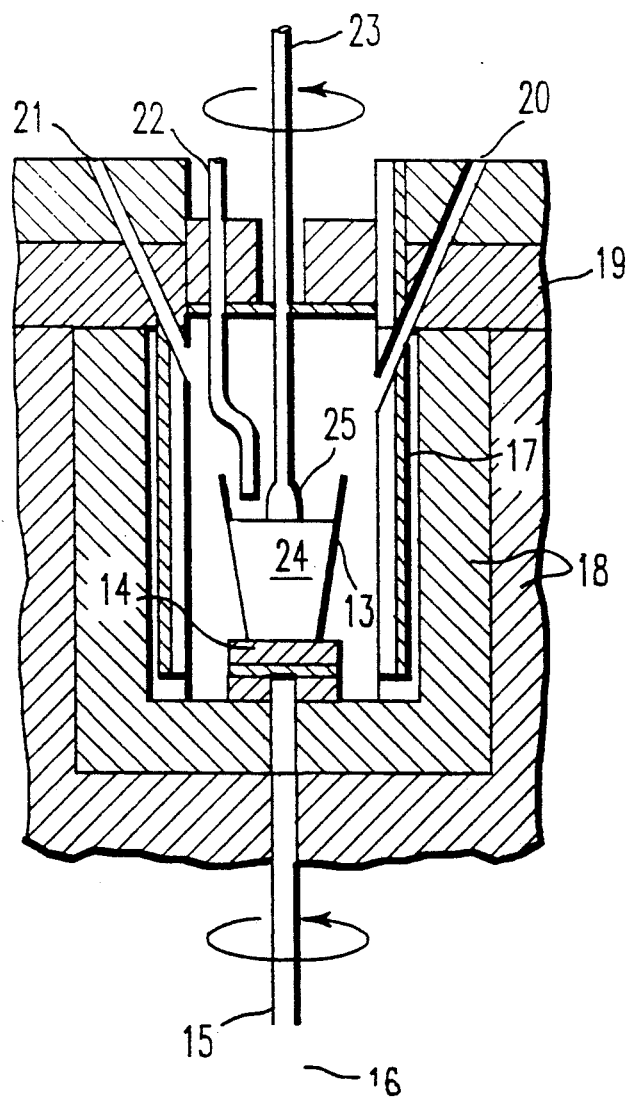
FIG. 2 is a sectional view of a single crystal growing apparatus using in the invention.

FIG. 2 shows the single crystal growing apparatus using in the invention. A platinum crucible 13 is arranged on a supporting pedestal 14 of the center of the growing apparatus. The supporting pedestal 14 is connected to a supporting rod 15 extending out of the body. The supporting pedestal 14 is rotated through the supporting rod 15. A thermoelectric couple 16 is connected to the supporting pedestal 14 through the supporting rod 15. The platinum crucible 13 arranged on the supporting pedestal 14 is rotatable.

A platinum heater 17 is arranged around the platinum crucible 13. A heatproof hearth object 18 surrounds the platinum heater 17. The upper part of the heatproof hearth aluminum 18 is sealed by a sealed object 19 of an aluminium oxide. An operator can watch the inside of the hearth from an inner observation window 20. Light is guided into the hearth through an inner observation light guide window 21. Gas is supplied into the hearth by a gas supplying pipe 22. A rotatable pulling shaft 23 is arranged above the platinum crucible 13.

The method of manufacturing of a YCuO single crystal substrate will be explained below. A solution 24 is formed from $BaCO_3$-$B_2O_3$ used as a flux and raw materials $Y_2O_3$ and CuO within the platinum crucible 13. The YCuO single crystal is manufactured from the solution 24.

Figure 3:
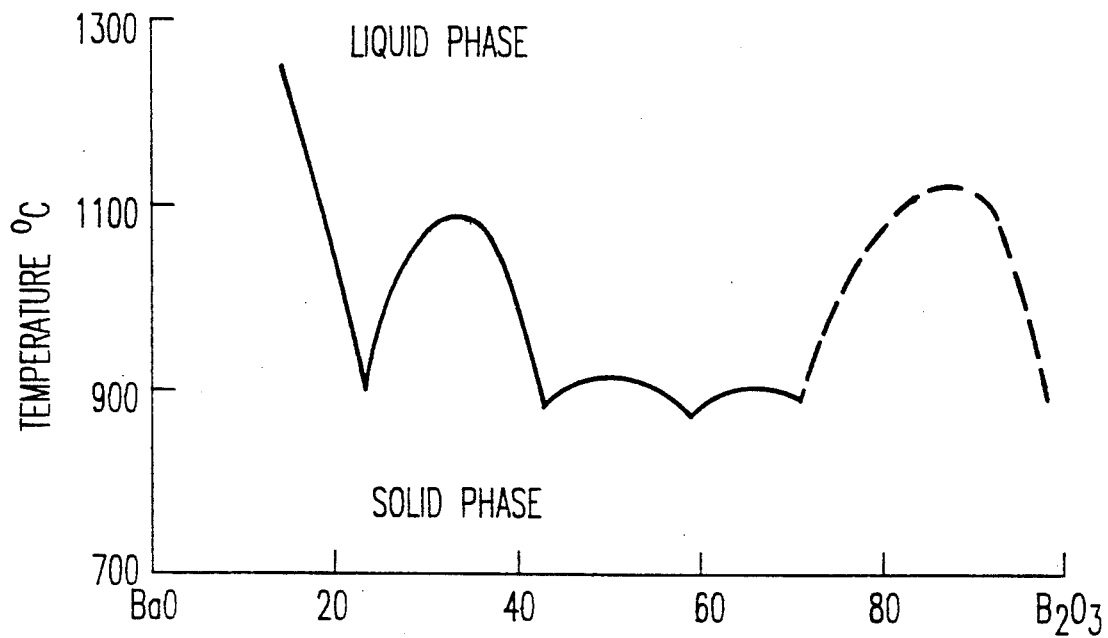
FIG. 3 is a phase diagram of the $BaO-B_2O_3$ as a flux using in the invention.

FIG. 3 shows the phase diagram when $BaO$-$B_2O_3$ is used as the flux in the invention. This phase becomes a liquid phase at about 900° C. by the appropriate selection of the mol % of $BaO$-$B_2O_3$. Namely, the flux of the selected phase can be selected so as to obtain a solution for growing of the YCuO single crystal a relative low temperature. The solution 24 within the crucible 13 is kept at 1200°–1300° C. during about 10 hours. Thereafter, the temperature of the solution 24 is set at 900°–1000° C. A seed crystal 25 of the YCuO single crystal is fitted on the tip of pulling shaft 23. The seed crystal 25 is dipped into the solution 24 to touch each other.

Thereafter, the YCuO single crystal 25 is grown by a gradual cooling speed of 0.1°–0.5° C./hour. The growing speed was 0.1–0.3 mm/hour. Oxygen gas is introduced in a amount of 100 ml/minute onto the surface of the solution 24 through the gas supplying pipe 22. Supplying oxygen gas can prevent the generation of oxygen faults being introduced into the solution and the grown crystal. The operator can watch the actual growing state the crucible from the inner observation window 20.

Thus, the YCuO single crystal using a single crystal substrate was grown under relative low temperature by the Kyropoulos technique as the solution sealing type growing process using a flux included in the constituent metal element Ba of the plural system oxide superconducting object $YBa_2Cu_3O_{7-\delta}$. The YCuO single crystal includes two constituent metal elements Y and Cu of the plural system oxide superconducting object $YBa_2Cu_3O_{7-\delta}$.

The grown YCuO single crystal is sliced and mirror polished. Thus, the single crystal substrate was obtained.

Next, the embodiment of the invention to form the plural system oxide superconducting single crystal thin film of the $YBa_2Cu_3O_{7-\delta}$ on a YCuO single crystal substrate will be explained using a FIG. 4.

Figure 4:
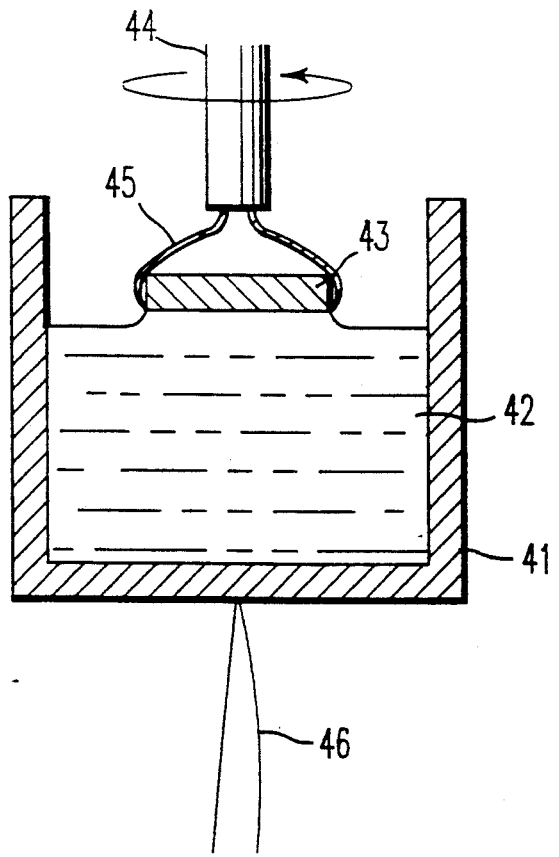
FIG. 4 is a sectional view of the enlarged portion of the epitaxy apparatus using in the invention.

FIG. 4 shows the enlarged part of the single crystal epitaxy apparatus to form the plural system oxide superconducting single crystal thin film of $YBa_2Cu_3O_{7-\delta}$. The detailed explanation of the epitaxy apparatus shown in FIG. 4 is omitted because of it was the same construction shown in the FIG. 2. The solution 42 of the $BaCO_3$-$B_2O_3$ (the $B_2O_3$ is 20–50 mol %) as the flux and the YCuO powder is provided into the platinum crucible 41. The YCuO single crystal substrate 43 is supported by the substrate holder 45 provided on the tip of the supporting rod 44.

The single crystal substrate 43 contracts the surface of the solution 42, and is pulled by high speed rotation of 50–100 rpm. The liquid phase epitaxy was carried out under a cooling speed of 0.1° C./hour or less. The temperature of the solution 42 is measured by a thermoelectric couple 46 provided on the platinum crucible 41. As a result, the uniform plural system oxide superconducting single crystal thin film 12 which a diameter of 2 cm and a thickness of 20–30 μm was manufactured on the single crystal substrate 11 of a YCuO.

Figure 5:
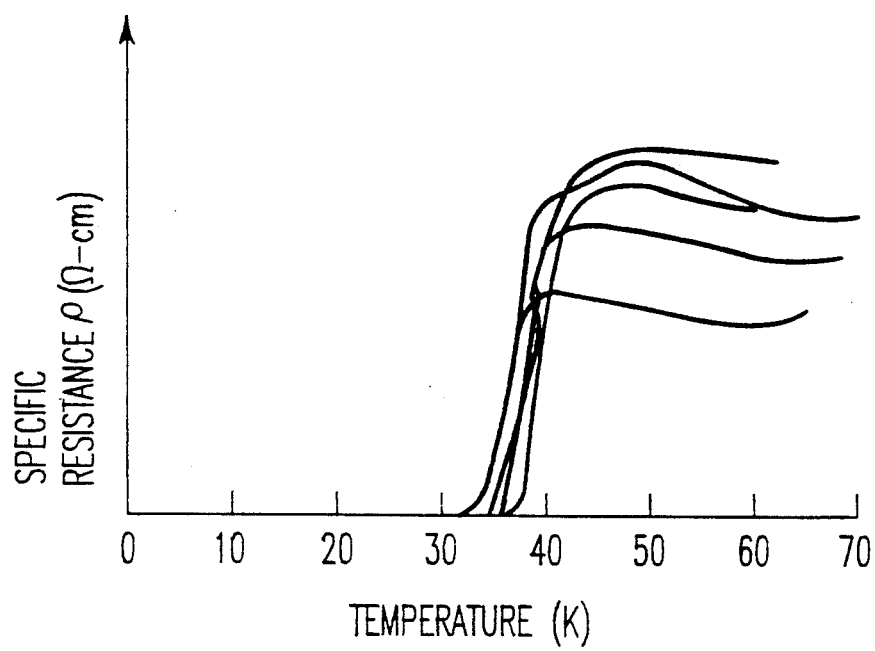
FIG. 5 is a measuring data diagram of the superconducting transposition temperature of the epitaxy wafer of the invention.

FIG. 5 is the measuring data diagram of the superconducting transposition temperatures of the epitaxy wafer of the invention. The superconducting transposition temperatures was measured at five points of the wafer in the direction of the diameter. Temperatures of the five points having zero electric resistance were in the same area of 30–38K. The uniformity of the five superconducting epitaxial wafers thus is shown.

In the abovementioned embodiments, the oxide single crystal object including at least two metal elements in constructing elements of the plural system oxide superconducting object was used as the crystal substrate because of the fit of the lattice alignment at the crystal epitaxy growth. If the lattice alignment between the crystal substrate and the epitaxy single crystal thin film thereon fits and do not detrimentally influence each other, it is possible to use a crystal substrate which does not include construction elements of the plural system oxide superconducting sigle crystal thin film.

The next embodiment relates to wherein the plural system oxide superconducting single crystal thin film on the crystal substrate does not include its construction elements. Namely, a superconducting thin film of $YBa_2Cu_3O_{7-\delta}$ was formed on a crystal substrate of $LiTaO_3$. The detailed explanation of the manufacturing apparatus is omitted because it is the same as in the abovementioned apparatus.

The raw material solution to form the crystal substrate was obtained by the following steps. The raw material powder of 100 g mixed the $LiCO_3$ and the $TaO_3$ having a ratio of 1:1 is provided into the crucible, and is melted at 1200° C. Thereafter, the single crystal of the $LiTaO_3$ was manufactured using the crystal growing process. The single crystal of the $LiTaO_3$ was sliced and the wafer was formed. The single crystal thin film of $YBa_2Cu_3O_{7-\delta}$ was formed on the single crystal wafer of $LiTaO_3$ using the same flux and the same process abovementioned. As the substrate single crystals of $LiNbO_3$ or $LaCuO_4$ in addition to the $LiTaO_3$, can be used.

In the abovementioned embodiments, fluxes used forming the single crystal substrate and for the superconducting single crystal thin film were the same solution of $BaCO_3$-$B_2O_3$. However, the fluxes are not limited only to $BaCO_3$-$B_2O_3$. Other embodiments of the invention in which two-phase oxides as fluxes are used are solutions of fluxes of $LiBO_2$-$NaBO_2$, $Na_2O$-$B_2O_3$, $K_2O$-$V_2O_5$, $K_2O$-$B_2O_3$, $K_2O$-$As_2O_5$, $K_2O$-$P_2O_5$ or $LiO$-$B_2O_3$, etc.

Figure 6:
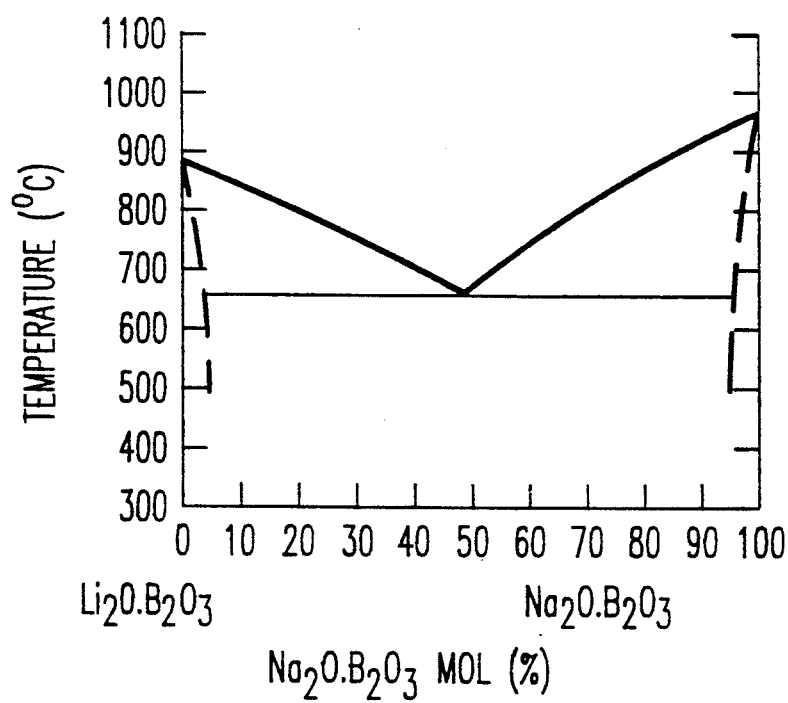
FIG. 6 is a phase diagram of the $LiBO_2-NaBO_2$ as the flux using in the invention.

FIG. 6 shows the phase diagram of $LiBO_2$-$NaBO_2$ as the flux. This phase becomes a liquid phase at about 900° C. or less by appropriate selection the mol % of the $LiBO_2$-$NaBO_2$. The solution is kept at 1200°–1300° C. during about 10 hours. Thereafter, the temperature of the solution is set at 900°–1000° C. The single crystal substrate of YCuO is dipped into the solution, and the liquid epitaxy growth of the superconducting single crystal thin film is done with a gradually cooling speed of 0.1°–0.5° C./hour.

Figure 7:
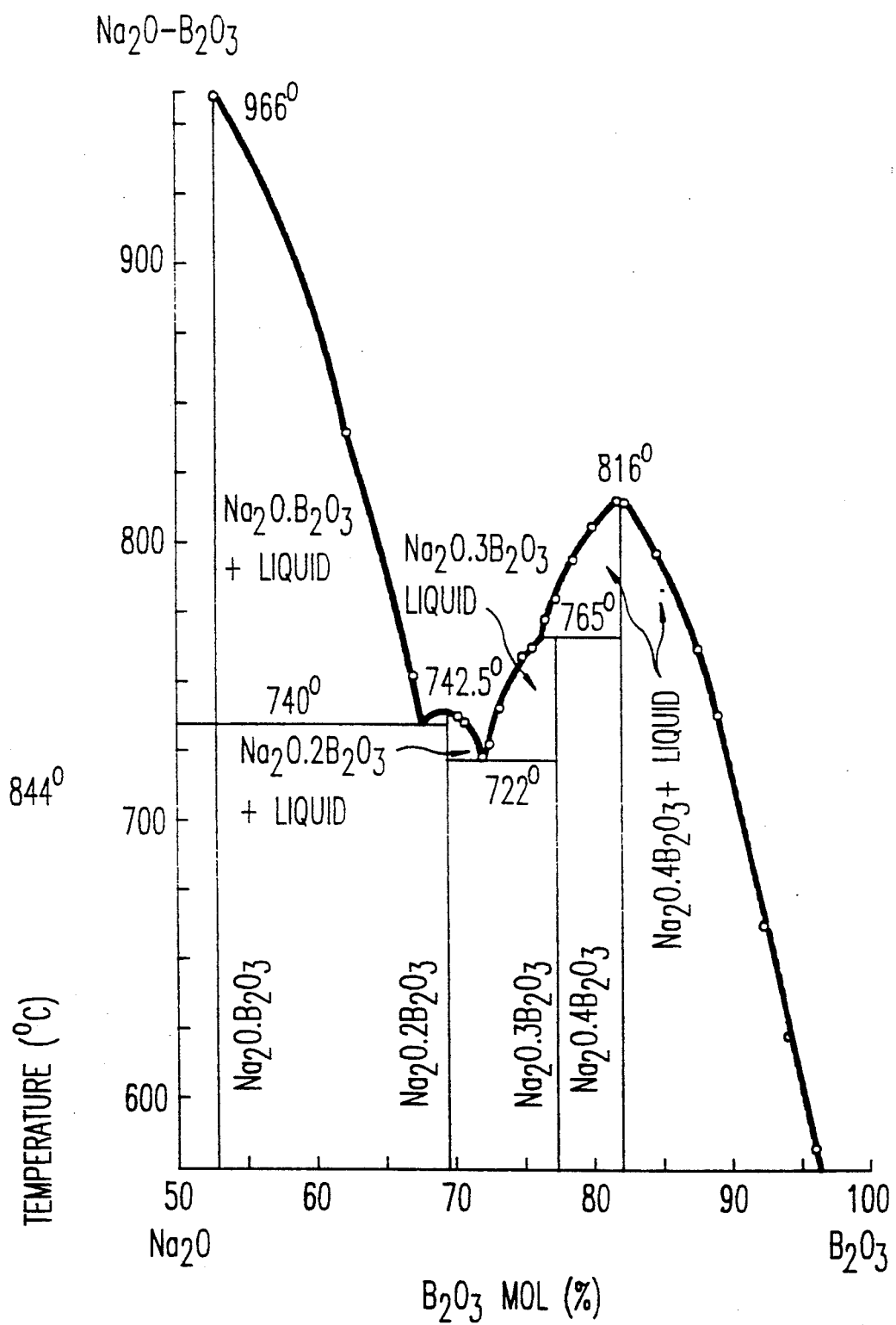
FIG. 7 is a phase diagram of the $Na_2O-B_2O_3$ as the flux using in the invention.

FIG. 7 shows the phase diagram of $Na_2O$-$B_2O_3$ as the flux. The solution of $Na_2O$-$B_2O_3$ (the $B_2O_3$ is 60–90 mol %) and raw materials are melted into the curcible. The solution is kept at 900°–1000° C. during about 10 hours. Thereafter, the temperature of the solution is set at 800°–900° C. The single crystal substrate of YCuO is dipped into the solution, and the liquid epitaxy growth of the superconducting single crystal thin film is done with a gradually cooling speed of the 0.1°–0.5° C./hour.

Figure 8:
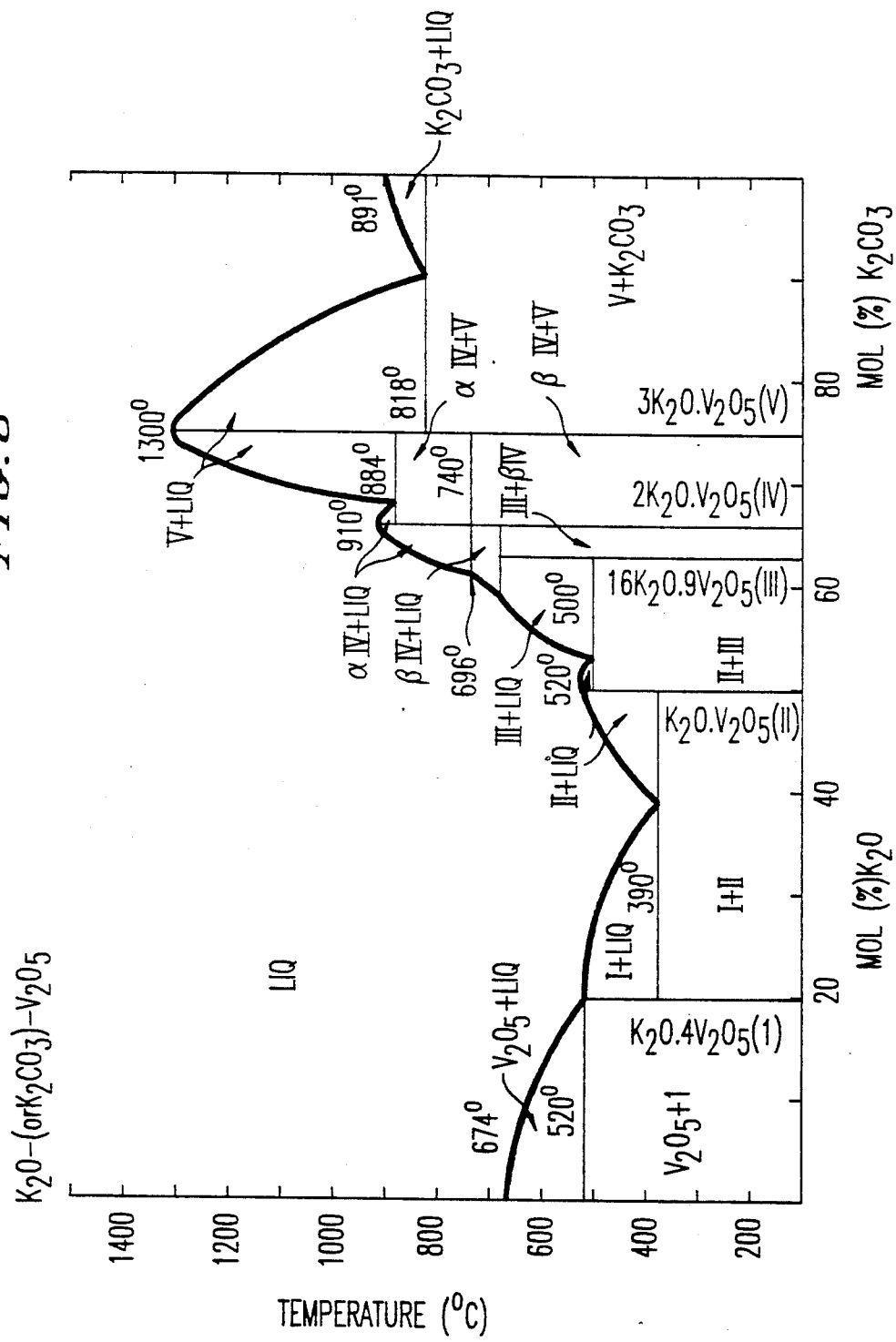
FIG. 8 is a phase diagram of $K_2O-V_2O_5$ as the flux using in the invention.

FIG. 8 shows the phase diagram of $K_2O$-$V_2O_5$ as the flux. The solution of $K_2O$-$V_2O_5$ (the $V_2O_5$ is the 65 mol % or less) and raw materials are melted into the crucible. The solution is kept at 1000° C. during about 10 hours. Thereafter, the temperature of the solution is set at 850°–900° C. The single crystal substrate of YCuO is dipped into the solution, and the liquid epitaxy growth of the superconducting single crystal thin film is done with a gradually cooling speed of the 0.1°–0.5° C./hour.

Figure 9:
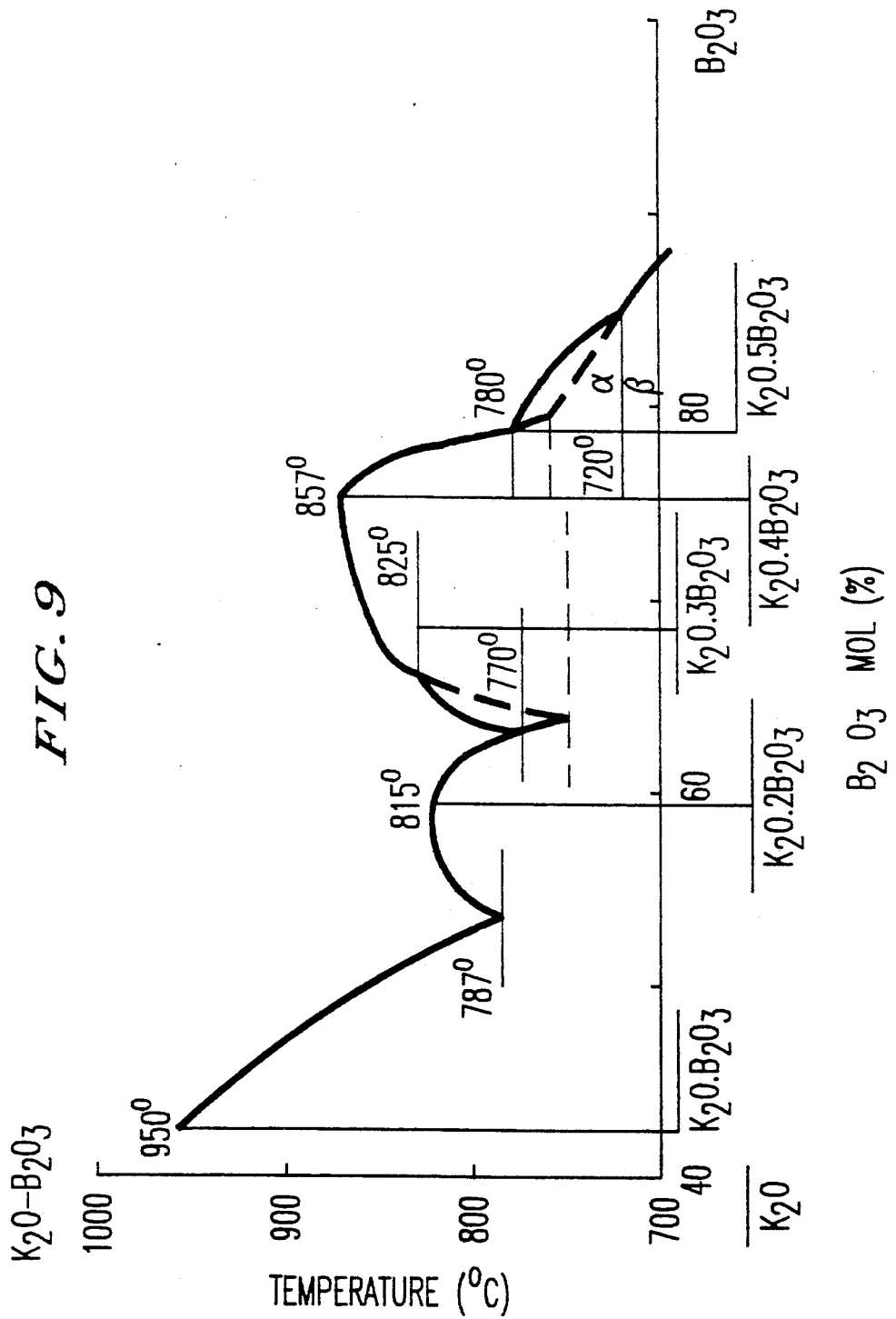
FIG. 9 is a phase diagram of $K_2O-B_2O_3$ as the flux using in the invention.

FIG. 9 shows the phase diagram of $K_2O$-$B_2O_3$ as the flux. The solution of $K_2O$-$B_2O_3$ (the $B_2O_5$ is 50–80 mol %) and raw materials are melted into the crucible. The solution is kept at 1200°–1300° C. during about 10 hours. Thereafter, the temperature of the solution is set at 900°–1000° C. The single crystal substrate of YCuO is dipped into the solution, and the liquid epitaxy growth of the superconducting single crystal thin film is done with a gradually cooling speed of the 0.1°–0.5° C./hour.

Figure 10:
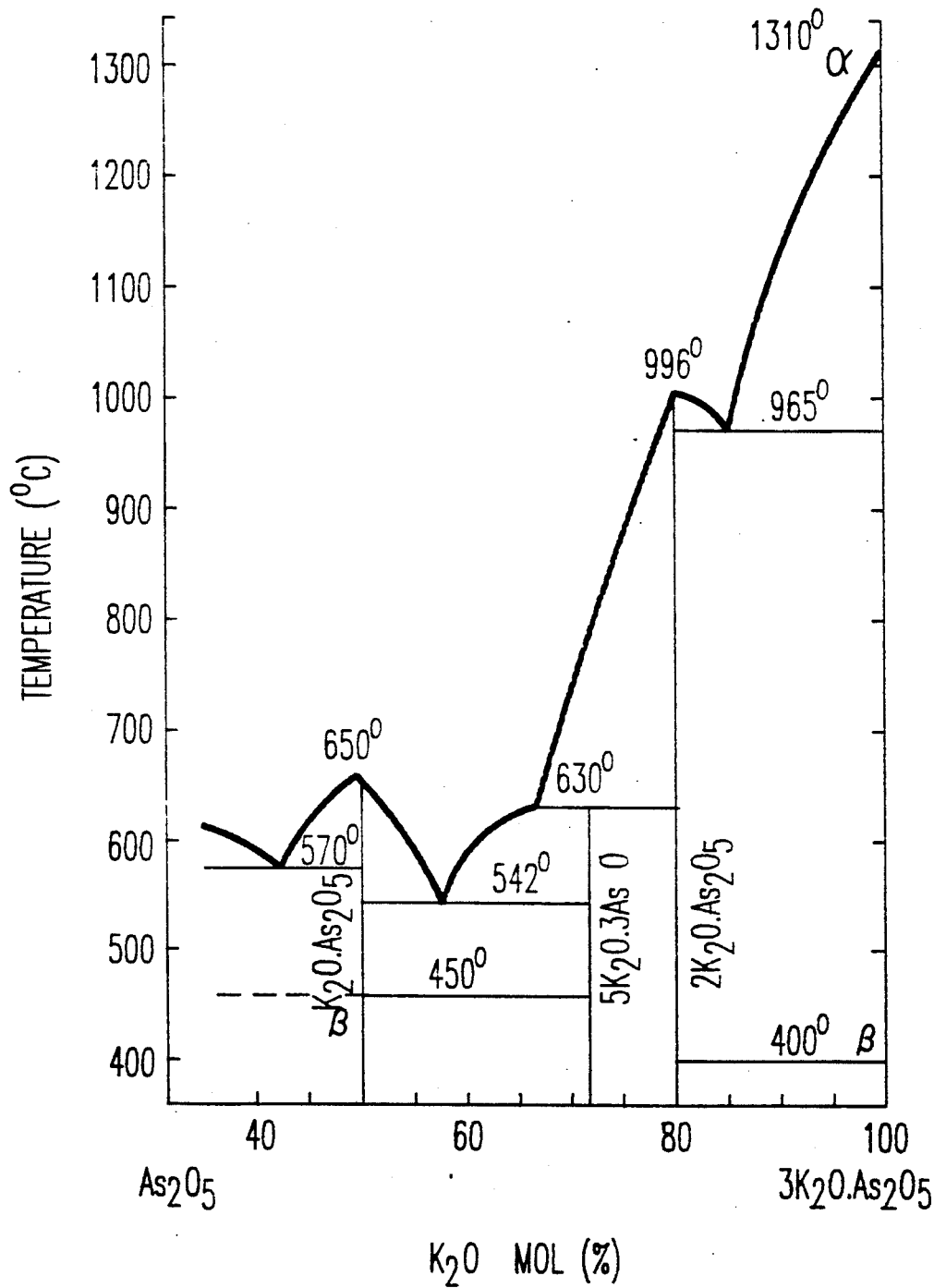
FIG. 10 is a phase diagram of $K_2O-As_2O_5$ as the flux using in the invention.

FIG. 10 shows the phase diagram of a $K_2O$-$As_2O_5$ as the flux. The solution of the $K_2O$-$As_2O_5$ (the $As_2O_5$ is 40–60 mol %) and raw materials are melted into the crucible. The solution is kept at 1200°–1300° C. during about 10 hours. Thereafter, the temperature of the solution is set at 900°–1000° C. The single crystal substrate of YCuO is dipped into the solution and the liquid epitaxy growth of the superconducting single crystal thin film is done with a gradually cooling speed of 0.1°–0.5° C./hour.

Figure 11:
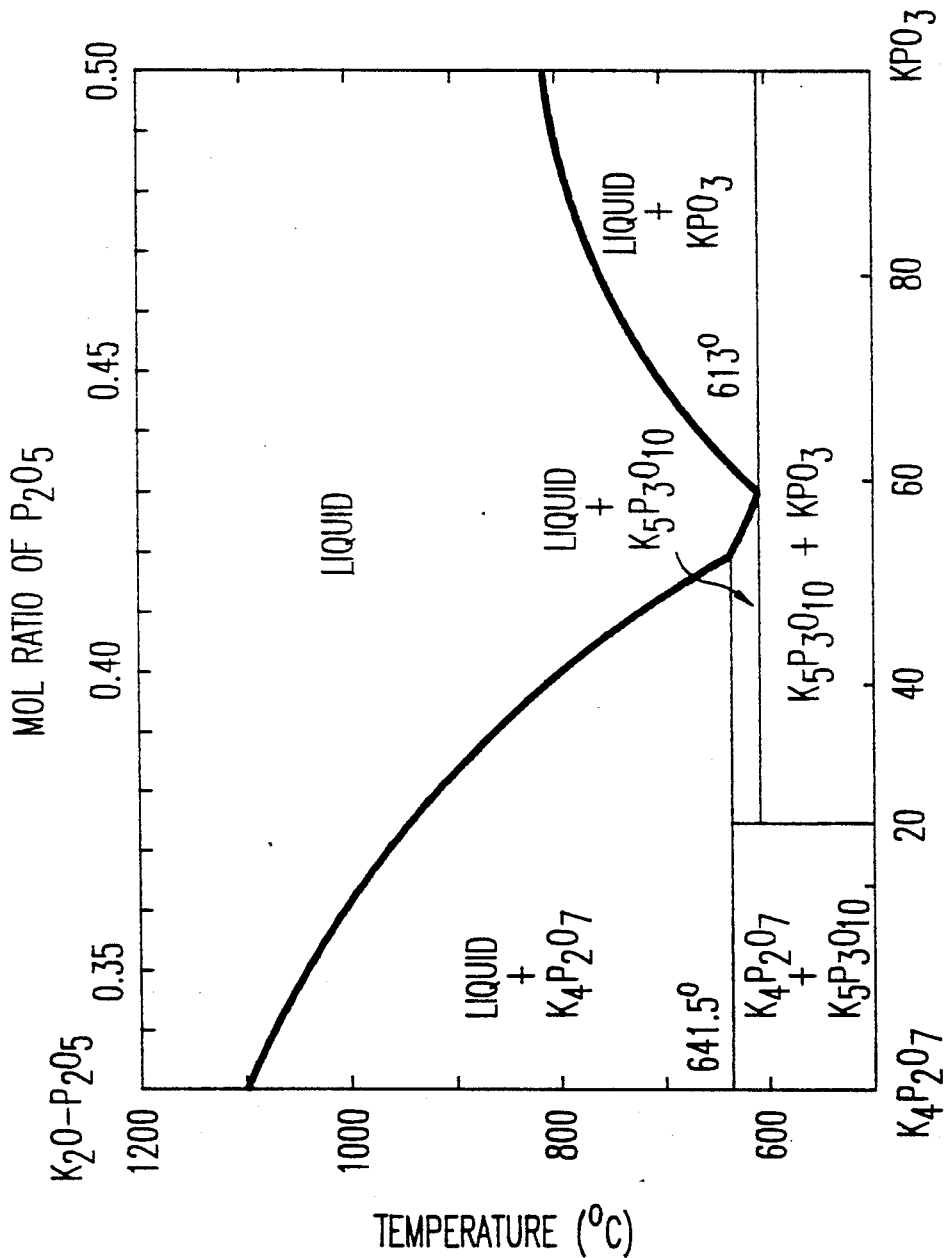
FIG. 11 is a phase diagram of $K_2O-P_2O_5$ as the flux using in the invention.

FIG. 11 shows the phase diagram of $K_2O$-$P_2O_5$ used as the flux. The solution of the $k_2O$-$P_2O_5$ and raw materials are melted into the crucible. The solution is kept at 1200°–1300° C. during about 10 hours. Thereafter, the temperature of solution is set at 900°–1000° C. The single crystal substrate of the YCuO is dipped into the solution and the liquid epitaxy growth of the superconducting single crystal thin film is done with a gradually cooling speed of 0.1°–0.5° C./hour.

Figure 12:
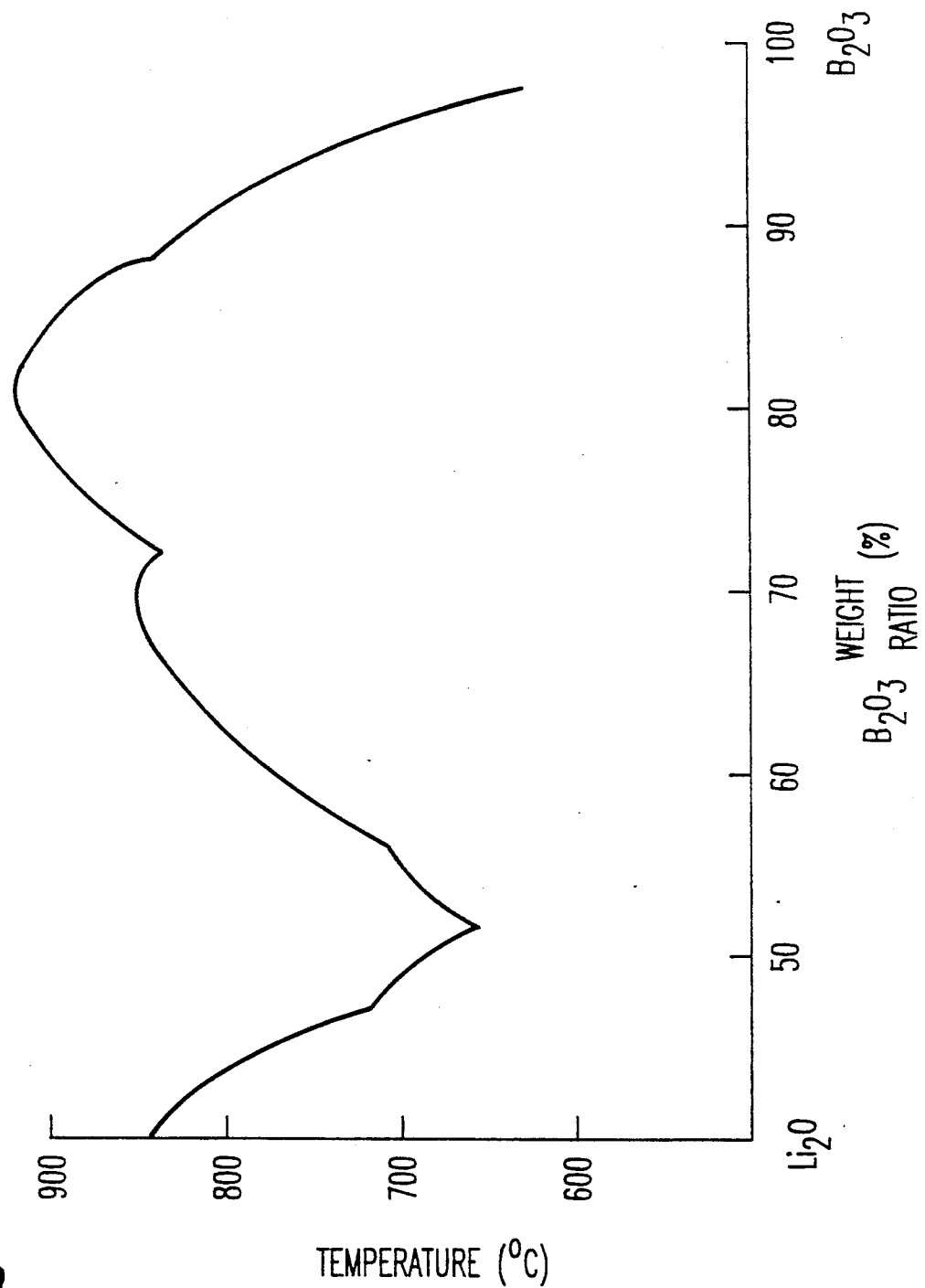
FIG. 12 is a phase diagram of $LiO-B_2O_3$ as the flux using in the invention.

FIG. 12 shows the phase diagram of $LiO_2$-$B_2O_3$ as the flux. The solution of $LiO_2$-$B_2O_3$ and raw materials are melted into the crucible. The solution is kept at 1200°–1300° C. during about 10 hours. Thereafter, the temperature of the solution is set at 900°–1000° C. The single crystal substrate of YCuO is dipped into the solution and the liquid epitaxy growth of the superconducting single crystal thin film is done with a gradually cooling speed of 0.1°–0.5° C./hour.

Other embodiments of the invention in which plural system oxides as fluxes as used including transition metals will be explained following.

Figure 13:
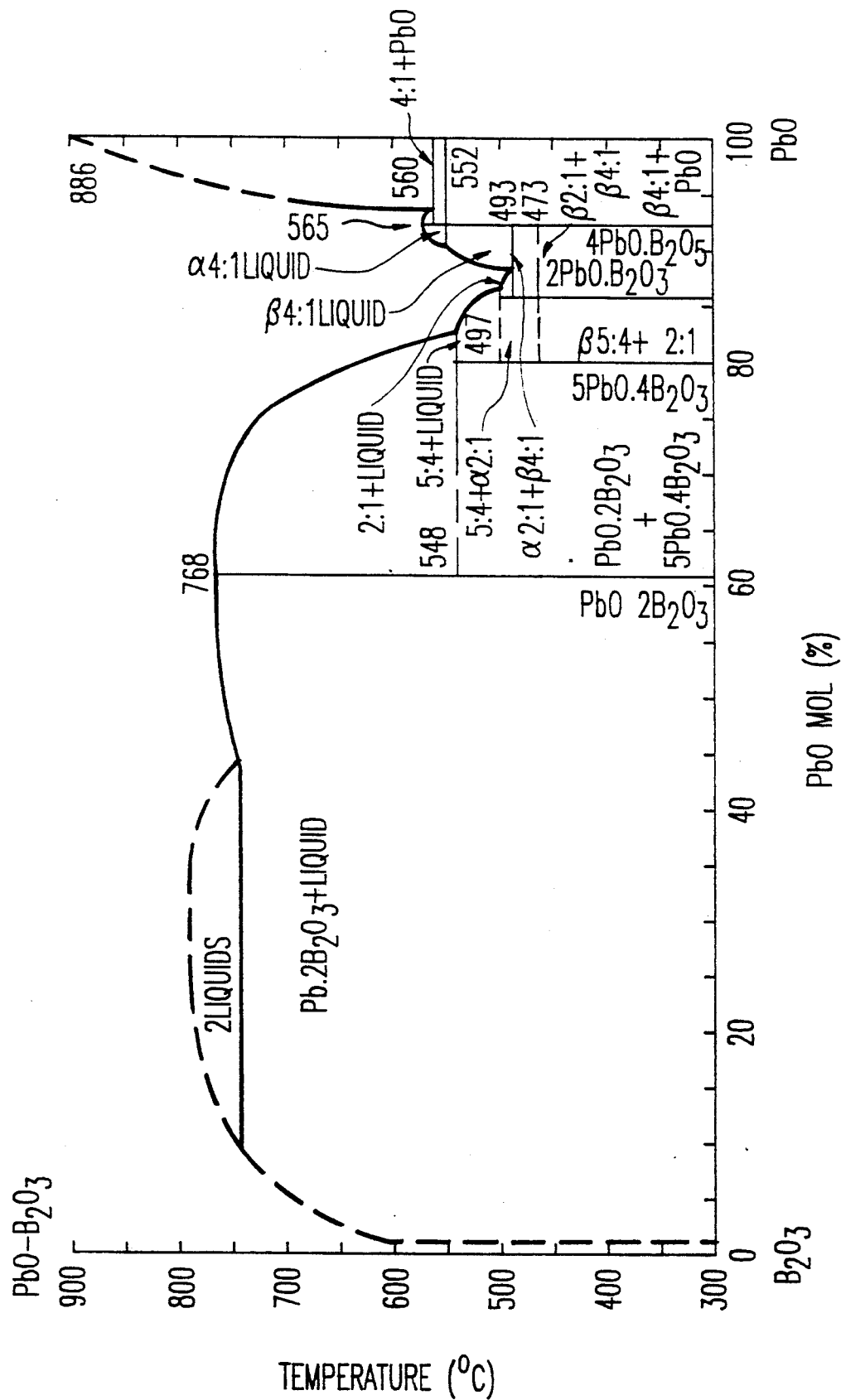
FIG. 13 is a phase diagram of $PbO-B_2O_3$ as the flux using in the invention.

FIG. 13 shows the phase diagram of PbO-$B_2O_3$ used as the flux. The solution of the PbO-$B_2O_3$ (the $B_2O_3$ is 50–70 mol %) and raw materials are melted into the crucible. The solution is kept at 900°–1000° C. during about 10 hours. Thereafter, the temperature of the solution is set at the 800°–900° C. The single crystal substrate of YCuO is dipped into the solution and the liquid epitaxy growth of the superconducting single crystal thin film is done with a gradually cooling speed of the 0.1°–0.5° C./hour.

Figure 14:
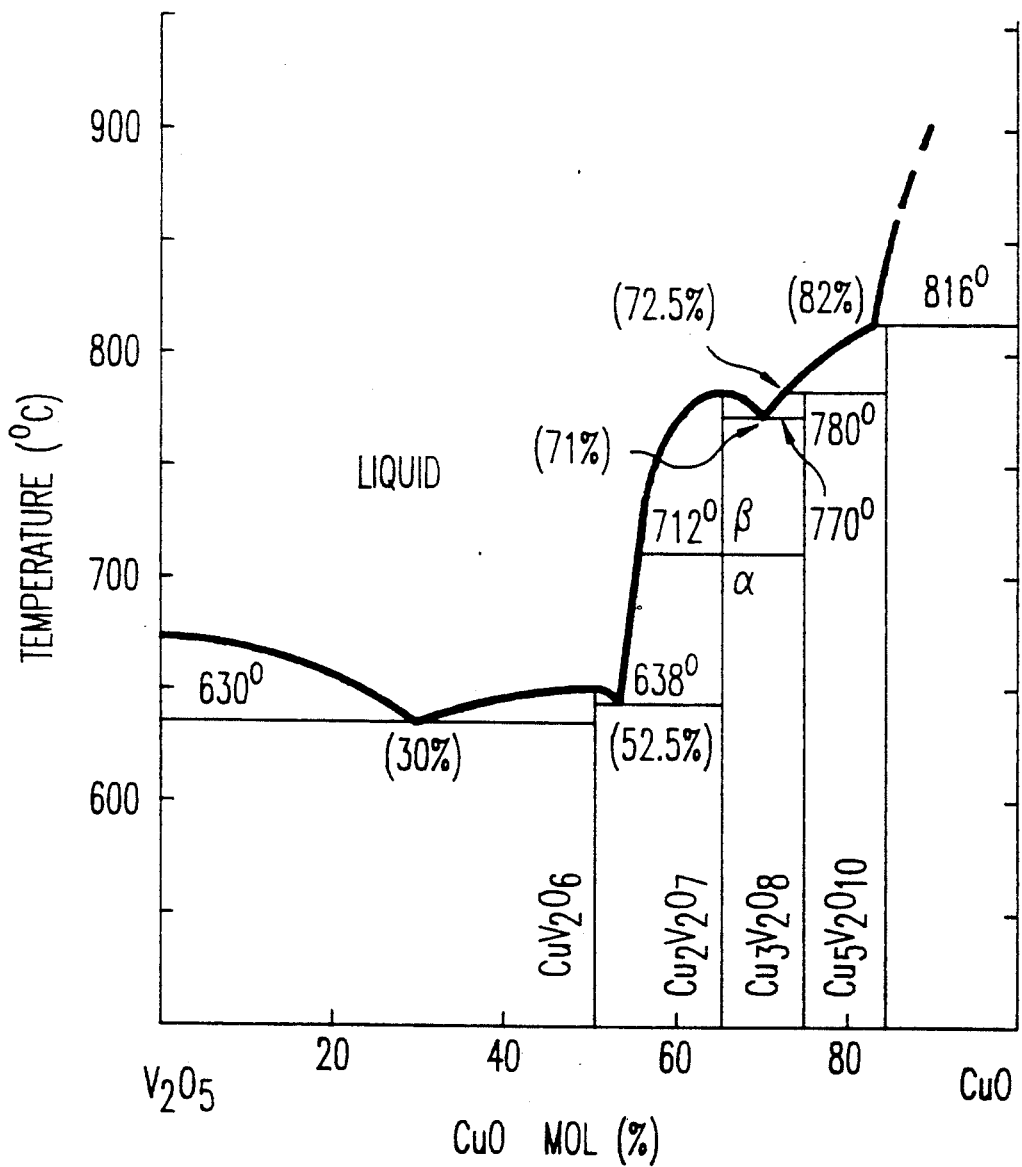
FIG. 14 is a phase diagram of $CuO-V_2O_5$ as the flux using in the invention.

FIG. 14 shows the phase diagram of CuO-$V_2O_5$ used as the flux. The solution of CuO-$V_2O_5$ (the CuO is 40 mol % or less) and raw materials are melted into the crucible. The solution is kept at 900°–1000° C. during about 10 hours. Thereafter, the temperature of the solution is set at 800°–900° C. The single crystal substrate of YCuO is dipped into the solution and the liquid epitaxy growth of the superconducting single crystal thin film is done with a gradually cooling speed of 0.1°–0.5° C./hour.

Other embodiments of the in which plural system oxides as fluxes are used including alkali metal fluorides will be explained following.

Figure 15:
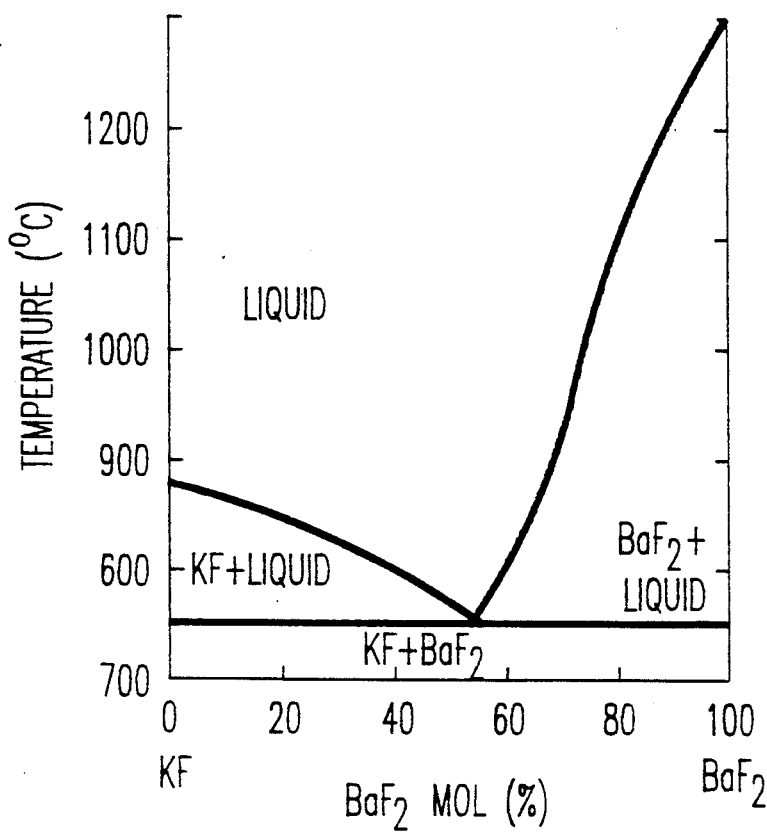
FIG. 15 is a phase diagram of $KF-BaF_2$ as the flux using in the invention.

FIG. 15 shows the phase diagram of KF-$BaF_2$ used as the flux. The solution of the KF-$BaF_2$ (the KF is 70 mol % or less) and raw materials are melted into the crucible. The solution is kept at 1200°–1300° C. during 10 hours. Thereafter, the temperature of the solution is set at 900°–1000° C. The single crystal substrate of YCuO is dipped into the solution and the liquid epitaxy growth of the superconducting single crystal thin film is done with a gradually cooling speed of 0.1°–0.5° C./hour. The mixing solution added to the BaO to the KF-BaF solution is also useful as the flux.

Figure 16:
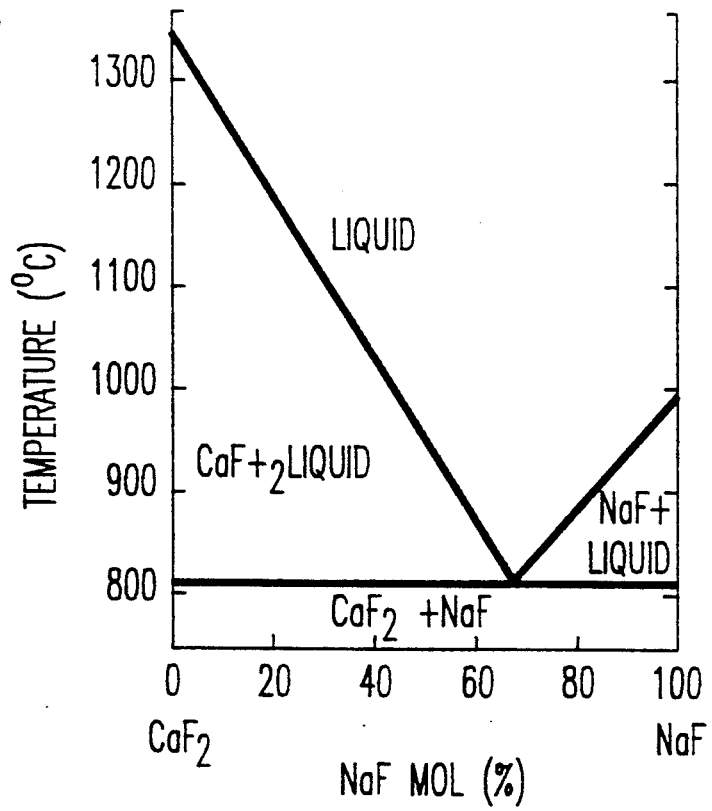
FIG. 16 is a phase diagram of $NaF-CaF_2$ as the flux using in the invention.

FIG. 16 shows the phase diagram of NaF-$CaF_2$ used as the flux. The solution of NaF-$CaF_2$ (the NaF is 40–80 mol %) and raw materials are melted into the crucible. The solution is kept at 1200°–1300° C. during about 10 hours. Thereafter, the temperature of the solution is set at 900°–1000° C. The single crystal substrate of YCuO is dipped into the solution and the liquid epitaxy growth of the superconducting single crystal thin film is done with a gradually cooling speed of 0.1°–0.5° C./hour.

Figure 17:
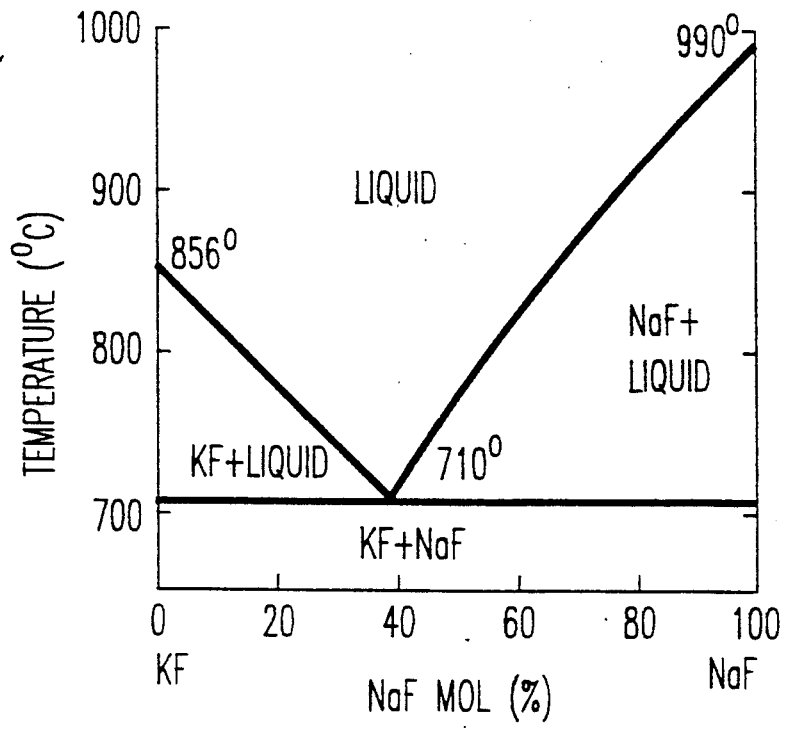
FIG. 17 is a phase diagram of $KF-NaF$ as the flux using in the invention.

FIG. 17 shows the phase diagram of KF-NaF used as the flux. The solution of KF-NaF (the NaF is 70 mol % or less) and raw materials are melted into the crucible. The solution is kept at 1200°–1300° C. during 10 hours. Thereafter, the temperature of the solution is set at 900°–1000° C. The single crystal substrate of YCuO is dipped into the solution and the liquid epitaxy growth of the superconducting single crystal thin film is done with a gradually cooling speed of the 0.1°–0.5° C./hour.

Figure 18:
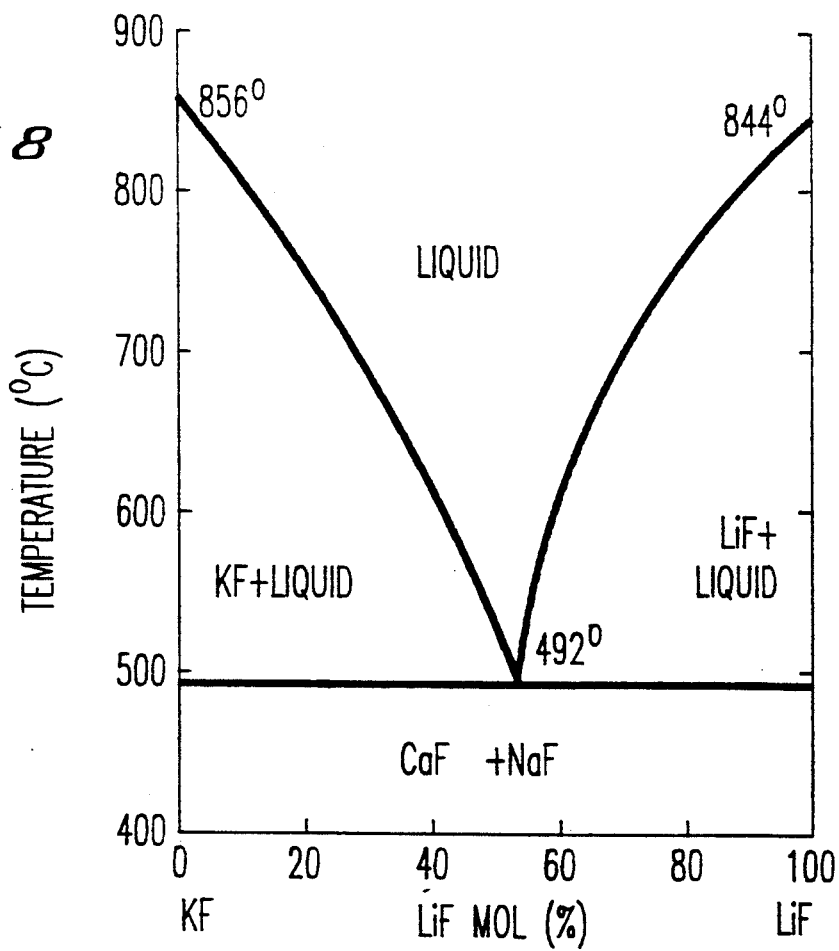
FIG. 18 ia a phase diagram of $LiF-KF$ as the flux using in the invention.
Figure 19A:
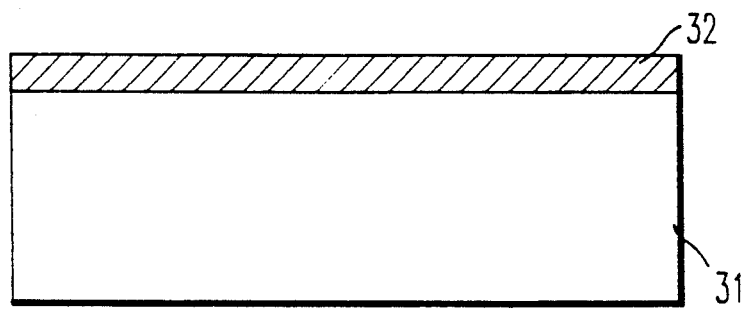
FIGS. 19(a) to (f) are sectional views shown the manufacturing steps of a semiconductor device applied according to the invention.
Figure 19B:
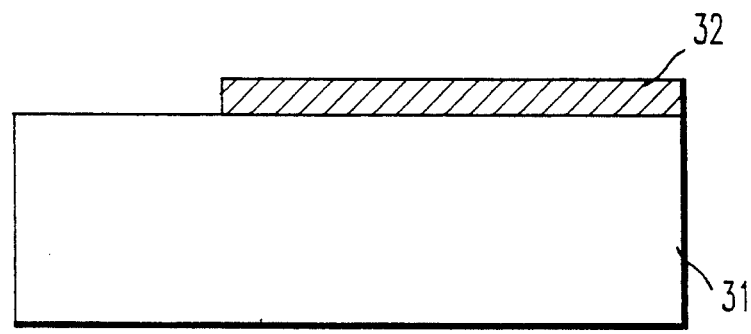
Figure 19C:
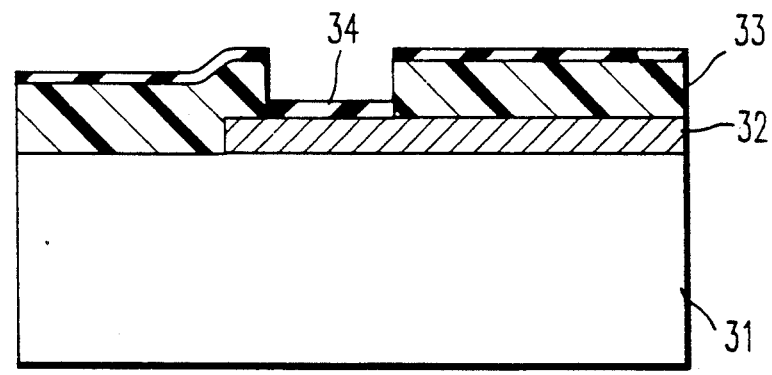
Figure 19D:
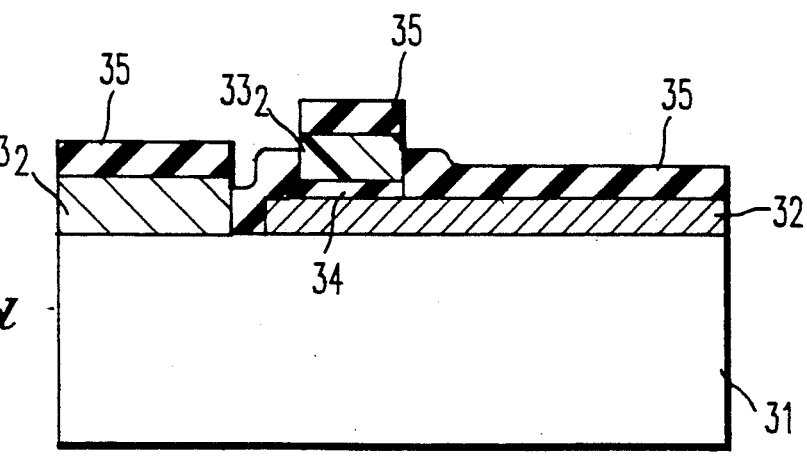
Figure 19E:
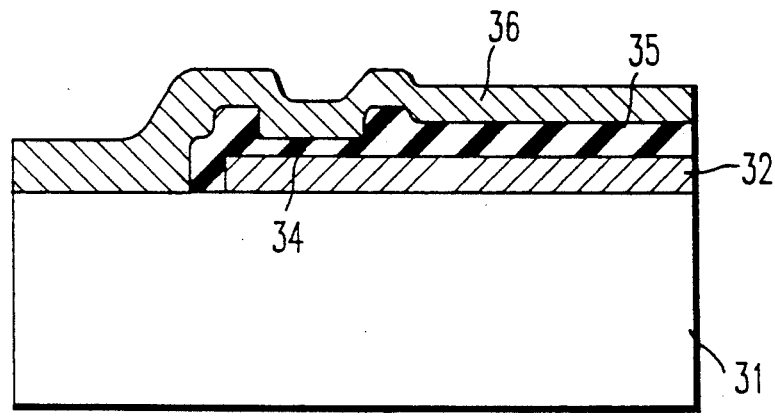
Figure 19F:
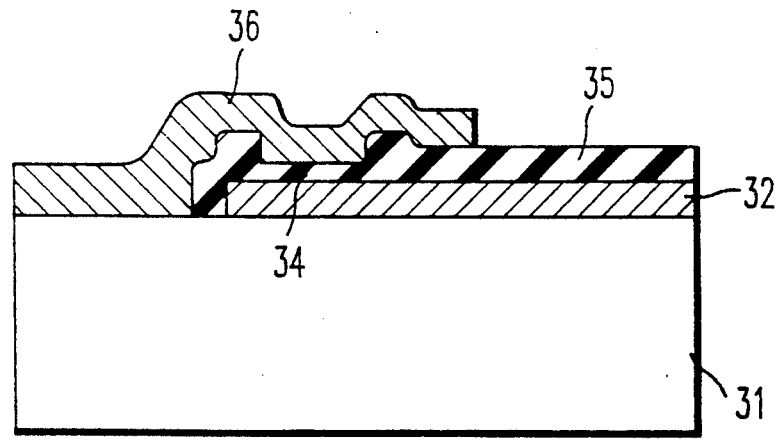

FIG. 18 shows the phase diagram of LiF-KF used as the flux. The solution of the LiF-KF and raw materials are melted into the crucible. The solution is kept at 1200°–1300° C. during about 10 hours. Thereafter, the temperature of the solution is set at 900°–1000° C. The single crystal substrate of YCuO is dipped into the solution and the liquid epitaxy growth of the superconducting single crystal thin film is done with a gradually cooling speed of 0.1°–0.5° C./hour.

FIGS. 19 (a)–(f) show the steps of manufacturing of a Josephson element according to the invention. The oxide superconducting wafer is constructed on a LiTaO$_3$ single crystal substrate and a $YBa_2Cu_3O_{7-\delta}$ superconducting single crystal layer 32 is formed thereon (shown in FIG. 19(a)). The $YBa_2Cu_3O_{7-\delta}$ layer 32 is patterned selectively (shown in FIG. 19(b)). A photo-resist layer $33_1$ covers the surface of the patterned $YBa_2Cu_3O_{7-\delta}$ layer 32, and a thin silicon nitride layer 34 of a thickness of about 80 Å is formed by a plasma CVD process on the $YBa_2Cu_3O_{7-\delta}$ layer 32 (shown in FIG. (c)). The photo-resist layer $33_1$ is removed and a new photo-resist layer $33_2$ is formed and a second silicon nitride layer 35 of the thickness of the 3000 Å is formed by a plasma CVD process (shown in FIG. 19 (d)). Thereafter, the second photo-resist layer $33_2$ is removed and a second $YBa_2Cu_3O_{7-\delta}$ layer 36 is formed (shown in FIG. 19(e)). The Josephson element is formed by patterning the $YBa_2Cu_3O_{7-\delta}$ layer 36 (shown in FIG. 19(f)). The Josephson element has a good junction characteristic and the critical current was $10^{16}$ A/cm$^2$. As the substrate is a LiNbO$_3$ single crystal or a Nb$_2$CuO$_3$ single crystal also is useful.

In abovementioned embodiments, the epitaxy growth of the YBa$_2$Cu$_3$O$_{7-\delta}$ single crystal was explained. However, the invention also is useful for the preparation of the oxide superconducting single crystal including rare-earth elements, for example, Yb, Ho, Dy, Eu, Er, Tm and Lu, etc., in place of Y. The invention is also useful for the preparation of plural system oxide superconducting single crystal having other Perovstkite structures, for example, the Sc-Ba-Cu-O phase or the phase replacing Ba by Sr or by Ca, etc.

What is claimed is:

1. A method of manufacturing a high temperature superconducting oxide wafer of the 1-2-3-type comprising steps of:
    liquid epitaxy growing a plural system oxide superconducting single crystal thin film on a crystal substrate using a flux including
    at least one different constituent metal element other than the constituent elements of said plural system oxide superconducting oxide thin film, wherein the surface of said crystal substrate is contacted with a solution including a plural system oxide superconducting raw materials and said flux; and
    forming a superconducting single crystal thin film on the crystal substrate by rotatingly pulling the substrate.

2. The method of manufacturing the superconducting oxide wafer of claim 1, wherein the crystal substrate includes at least two metal oxides of constituent elements of the plural system oxide superconducting single crystal thin film.

3. The method of manufacturing the superconducting oxide wafer of claim 1, wherein the plural system oxide superconducting single crystal thin film is an ABa$_2$Cu$_3$O$_{7-\delta}$ (A is an element selected from Y, Yb, Ho, Dy, En, Er, Tm or Lu).

4. The method of manufacturing the superconducting oxide wafer of claim 1, wherein oxygen gas is injected onto the surface of the solution during the liquid epitaxy growing.

5. The method of manufacturing the superconducting oxide wafer of claim 1, wherein the crystal substrate includes at least two different metal oxides of constituent elements of the plural system oxide superconducting single crystal thin film.

6. The method of manufacturing the superconducting oxide wafer of claim 1, wherein a flux is the plural system oxide including an alkali metal oxide.

7. The method of manufacturing the superconducting oxide wafer of claim 1, wherein the flux of the plural system oxide includes a transition metal oxide.

8. The method of manufacturing the superconducting oxide wafer of claim 1, wherein a flux is the plural system oxide including an alkali metal fluoride.

9. The method of manufacturing the superconducting oxide wafer of claim 3, wherein the flux includes at least a B oxide.

10. The method of manufacturing the superconducting oxide wafer of claim 6, wherein the plural system oxide superconducting single crystal thin film is ABa$_2$Cu$_3$O$_{7-\delta}$ (A is an element selected from Y, Yb, Ho, Dy, Eu, Er, Tm or Lu).

11. The method of manufacturing the superconducting oxide wafer of claim 6, wherein the flux is a solution of LiBO$_2$-NaBO$_2$.

12. The method of manufacturing the superconducting oxide wafer of claim 6, wherein a flux is the solution of Na$_2$O-B$_2$O$_3$.

13. The method of manufacturing the superconducting oxide wafer of claim 6, wherein a flux is the solution of K$_2$O-V$_2$O$_5$.

14. The method of manufacturing the superconducting oxide wafer of claim 6, wherein a flux is the solution of K$_2$O-As$_2$O$_5$.

15. The method of manufacturing the superconducting oxide wafer of claim 6, wherein a flux is the solution of K$_2$O-P$_2$O$_5$.

16. The method of manufacturing the superconducting oxide wafer of claim 6, wherein a flux is the solution of LiO-B$_2$O$_3$.

17. The method of manufacturing the superconducting oxide wafer of claim 7, wherein the plural system oxide superconducting single crystal thin film is ABa$_2$Cu$_3$O$_{7-\delta}$ (A is an element selected from Y, Yb, Ho, Dy, Eu, Eu, Tm or Lu).

18. The method of manufacturing the superconducting oxide wafer of claim 7, wherein a flux is the solution of PbO-B$_2$O$_3$.

19. The method of manufacturing the superconducting oxide wafer of claim 7, wherein a flux is the solution of CuO-V$_2$O$_5$.

20. The method of manufacturing of the superconducting oxide wafer of claim 8, wherein the plural system oxide superconducting single crystal thin film is the ABa$_2$Cu$_3$O$_{7-\delta}$ (A is an element selected from Y, Nb, Ho, Dy, Eu, Er, Tm or Lu).

21. The method of manufacturing the superconducting oxide wafer of claim 8, wherein the flux is the solution of the KF-BaF$_2$.

22. The method of manufacturing the superconducting oxide wafer of claim 8, wherein the flux is the solution of the NaF-CaF$_2$.

23. The method of manufacturing the superconducting oxide wafer of claim 8, wherein the flux is the solution of the KF-NaF.

24. The method of manufacturing the superconducting oxide wafer of claim 8, wherein the flux is the solution of the LiF-KF.

25. A method of manufacturing a high temperature superconducting oxide wafer, comprising the step of:
    liquid epitaxy growing a superconducting single crystal thin film of YBa$_2$CuO$_{7-\delta}$ or (La, Ba)$_2$CuO$_{4-y}$ on a crystal substrate of LiNbO$_3$.

26. A method of manufacturing a high temperature superconducting oxide wafer, comprising step of:
    liquid epitaxy growing a superconducting single crystal thin film of YBa$_2$CuO$_{7-\delta}$ or (La, Ba)$_2$CuO$_{4-y}$ on a crystal substrate of LiTaO$_3$.

27. A method of manufacturing a high temperature superconducting oxide wafer, comprising the step of:
    liquid epitaxy growing a superconducting single crystal thin film of YBa$_2$CuO$_{7-\delta}$ or (La, Ba)$_2$CuO$_{4-y}$ on a crystal substrate of Nb$_2$CuO$_3$.

* * * * *